US012796469B2

(12) United States Patent
Kim et al.

(10) Patent No.: US 12,796,469 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Byungho Kim, Suwon-si (KR); Youngchan Ko, Suwon-si (KR); Gyeongho Kim, Suwon-si (KR); Yongkoon Lee, Suwon-si (KR); Myungdo Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 18/403,936

(22) Filed: Jan. 4, 2024

(65) Prior Publication Data

US 2024/0421034 A1 Dec. 19, 2024

(30) Foreign Application Priority Data

Jun. 14, 2023 (KR) ........................ 10-2023-0076423

(51) Int. Cl.
*H01L 23/42* (2006.01)
*H01L 23/15* (2006.01)
(Continued)

(52) U.S. Cl.
CPC .......... *H10W 40/70* (2026.01); *H10W 70/611* (2026.01); *H10W 70/635* (2026.01);
(Continued)

(58) Field of Classification Search
CPC ..... H10W 40/70; H10W 40/22; H10W 40/28; H10W 40/228; H10W 70/611;
(Continued)

(56) References Cited

U.S. PATENT DOCUMENTS 10,177,103 B1 1/2019 Hee et al.
10,796,926 B2 10/2020 Obata et al.
(Continued)

FOREIGN PATENT DOCUMENTS

KR 10-2433150 8/2022

*Primary Examiner* — Nikolay K Yushin
(74) *Attorney, Agent, or Firm* — Morgan, Lewis & Bockius LLP

(57) ABSTRACT

A semiconductor package includes: a first redistribution structure including a first insulating layer and first conductive patterns; a connection substrate on the first redistribution structure, and including a base layer and a through electrode penetrating the base layer, wherein the base layer includes a first material; a molding layer at least partially surrounding the connection substrate and disposed on the first redistribution structure, wherein the molding layer includes a second material; a second redistribution structure disposed on the molding layer and the connection substrate; and a plurality of semiconductor devices spaced apart from each other on the second redistribution structure, wherein a first thermal expansion coefficient of the first material of the base layer is less than a second thermal expansion coefficient of the second material of the molding layer, and wherein an upper surface of the base layer is substantially coplanar with an upper surface of the molding layer.

20 Claims, 9 Drawing Sheets

(51) Int. Cl.

| | |
|---|---|
| ***H01L 23/498*** | (2006.01) |
| ***H01L 23/538*** | (2006.01) |
| ***H01L 25/065*** | (2023.01) |
| ***H10W 40/70*** | (2026.01) |
| ***H10W 70/60*** | (2026.01) |
| ***H10W 70/63*** | (2026.01) |
| ***H10W 70/692*** | (2026.01) |
| ***H10W 90/00*** | (2026.01) |
| *H10W 74/15* | (2026.01) |

(52) U.S. Cl.
CPC ......... *H10W 70/692* (2026.01); *H10W 90/00* (2026.01); *H10W 90/701* (2026.01); *H10W 74/15* (2026.01); *H10W 90/722* (2026.01); *H10W 90/724* (2026.01); *H10W 90/734* (2026.01)

(58) Field of Classification Search
CPC ... H10W 70/60; H10W 70/635; H10W 70/63; H10W 70/692; H10W 70/614; H10W 70/685; H10W 90/00; H10W 90/701; H10W 90/722; H10W 90/724; H10W 90/734; H10W 90/401; H10W 20/42; H10W 20/042; H10W 20/0698; H10W 20/20
See application file for complete search history.

(56) References Cited

U.S. PATENT DOCUMENTS

| | | | | |
|---|---|---|---|---|
| 10,797,017 | B2 | 10/2020 | Lin et al. | |
| 11,355,465 | B2 | 6/2022 | Mitarai et al. | |
| 11,380,616 | B2 * | 7/2022 | O'Sullivan ........... | H10W 20/42 |
| 11,482,982 | B2 * | 10/2022 | Inoue ................. | H03H 9/02897 |
| 2013/0242493 | A1 | 9/2013 | Shenoy et al. | |
| 2015/0195907 | A1 | 7/2015 | Chung et al. | |
| 2019/0355659 | A1 * | 11/2019 | O'Sullivan ........... | H10W 20/42 |
| 2020/0395313 | A1 | 12/2020 | Mallik et al. | |
| 2021/0005542 | A1 | 1/2021 | Mallik et al. | |

* cited by examiner

SEMICONDUCTOR PACKAGE

CROSS-REFERENCE TO RELATED APPLICATION

This application claims priority under 35 U.S.C. § 119 to Korean Patent Application No. 10-2023-0076423, filed on Jun. 14, 2023, in the Korean Intellectual Property office, the disclosure of which is incorporated by reference herein in its entirety.

TECHNICAL FIELD

The present inventive concept relates to a semiconductor package.

DISCUSSION OF THE RELATED ART

Electronic devices have become more compact with versatile performance, and large capacity according to the rapid development of the electronic industry and demands of users. Accordingly, semiconductor packages including a plurality of semiconductor devices are currently under development. Recently, a method of mounting various types of semiconductor chips side-by-side on an interposer has been under development. In the case of the semiconductor package to which the interposer is applied, research is being conducted to reduce damage caused by warpage while a relatively large area of the interposer is secured for mounting a plurality of semiconductor devices.

SUMMARY

According to an embodiment of the present inventive concept, a semiconductor package includes: a first redistribution structure including a first insulating layer and first conductive patterns; a connection substrate disposed on the first redistribution structure, and including a base layer and a through electrode penetrating the base layer, wherein the base layer includes a first material; a molding layer at least partially surrounding the connection substrate and disposed on the first redistribution structure, wherein the molding layer includes a second material; a second redistribution structure disposed on the molding layer and the connection substrate, and including a second insulating layer and second conductive patterns, and a plurality of semiconductor devices spaced apart from each other on the second redistribution structure, wherein a first thermal expansion coefficient of the first material of the base layer is less than a second thermal expansion coefficient of the second material of the molding layer, and wherein an upper surface of the base layer is substantially coplanar with an upper surface of the molding layer.

According to an embodiment of the present inventive concept, a semiconductor package includes: a first redistribution structure including a first insulating layer and first conductive patterns; a connection substrate disposed on the first redistribution structure, and including a base layer and a through electrode configured to penetrate the base layer, wherein the base layer includes glass; a molding layer at least partially surrounding the connection substrate on the first redistribution structure and including an epoxy mold compound; a second redistribution structure disposed on the molding layer and the connection substrate, and including a second insulating layer and second conductive patterns; and a plurality of semiconductor devices spaced apart from each other on the second redistribution structure, wherein an upper surface of the base layer is substantially coplanar with an upper surface of the molding layer, and wherein the second insulating layer extends along the upper surface of the base layer and the upper surface of the molding layer.

According to an embodiment of the present inventive concept, a semiconductor package includes: a first redistribution structure including a first insulating layer and first conductive patterns; a connection substrate mounted on the first redistribution structure, and including a base layer and a through electrode configured to penetrate the base layer, wherein the base layer includes a first material; first connection bumps disposed between the connection substrate and the first redistribution structure; a bridge chip mounted on the first redistribution structure and spaced apart from the connection substrate in a lateral direction, wherein the bridge chip includes a bridge circuit pattern; second connection bumps disposed between the bridge chip and the first redistribution structure; a plurality of conductive pillars disposed on the bridge chip, and electrically connected to the bridge circuit pattern; a molding layer at least partially surrounding the connection substrate and the bridge chip on the first redistribution structure and including a second material; a second redistribution structure disposed on the molding layer and the connection substrate, and including a second insulating layer and second conductive patterns; and a plurality of semiconductor devices spaced apart from each other and disposed on the second redistribution structure, wherein a first thermal expansion coefficient of the first material of the base layer is less than a second thermal expansion coefficient of the second material of the molding layer, wherein an upper surface of the base layer is substantially coplanar with an upper surface of the molding layer, wherein the second insulating layer extends along the upper surface of the base layer and the upper surface of the molding layer, and wherein the second conductive patterns include a conductive via pattern extending in the second insulating layer and contacting an upper surface of the through electrode.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
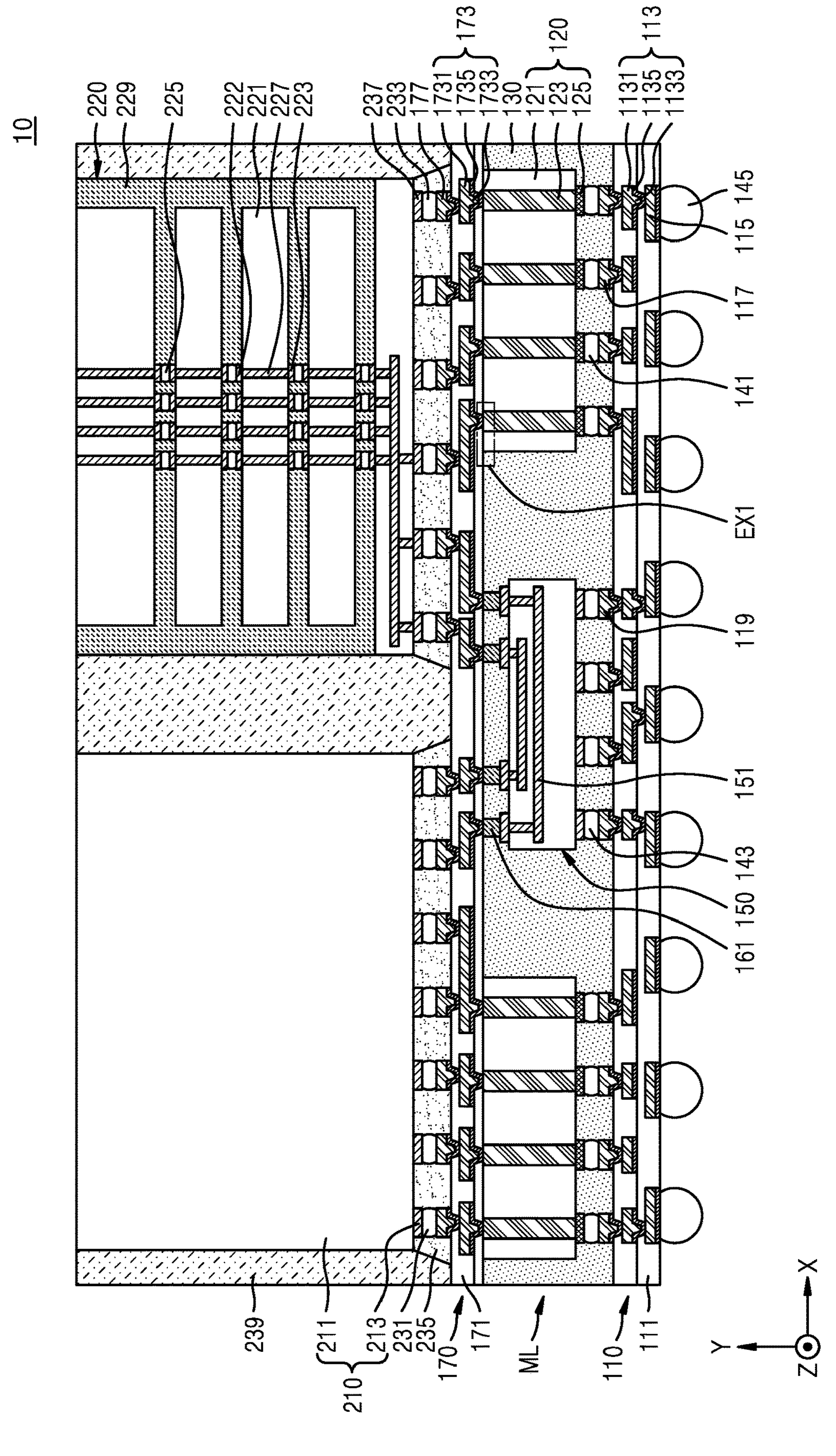
FIG. 1 is a cross-sectional view of a semiconductor package according to an embodiment of the present inventive concept.

Hereinafter, embodiments of the present inventive concept will be described in detail with reference to the accompanying drawings. Identical reference numerals are used for the same constituent elements in the drawings, and duplicate descriptions thereof are omitted or briefly discussed.

It will be understood that a vertical direction may be a Z direction, and a horizontal direction may be a direction substantially perpendicular to the Z direction. A first horizontal direction and a second horizontal direction may be directions crossing each other. For example, the first horizontal direction may be referred to as an X direction, and the second horizontal direction may be referred to as a Y direction. A horizontal width of a component, element, or layer may be referred to as a length in the horizontal direction.

Figure 2:
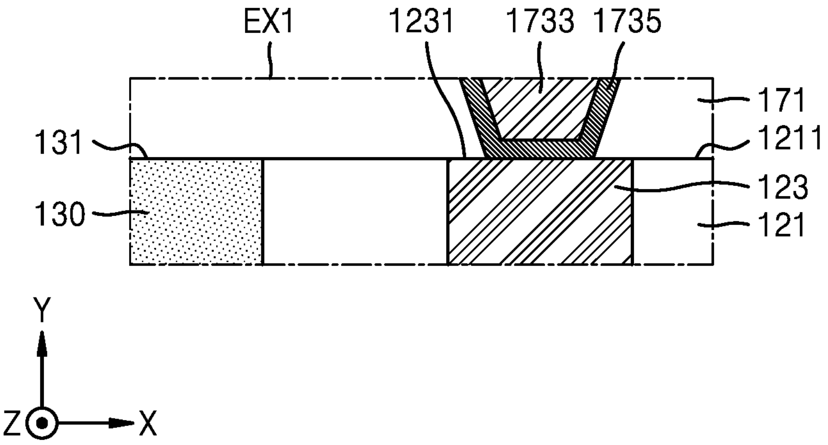
FIG. 2 is an enlarged diagram of a region EX1 in FIG. 1.

FIG. 1A is a cross-sectional view of a semiconductor package 10 according to an embodiment of the present inventive concept. FIG. 2 is an enlarged diagram of a region EX1 in FIG. 1.

Referring to FIGS. 1 and 2, the semiconductor package 10 may include a first redistribution structure 110, an intermediate connection structure ML, a second redistribution structure 170, and a plurality of semiconductor devices (for example, a first semiconductor device 210 and a second semiconductor device 220).

The first redistribution structure 110 may include a structure to which external connection terminals 145 are attached. In some embodiments of the present inventive concept, the first redistribution structure 110 may include a redistribution substrate manufactured by performing a redistribution process. In some embodiments of the present inventive concept, the first redistribution structure 110 may include a printed circuit board. For example, the first redistribution structure 110 may also be referred to as a substrate or a package substrate.

The first redistribution structure 110 may include a first redistribution insulating layer 111 and first conductive redistribution patterns 113.

The first redistribution insulating layer 111 may include a plurality of first sub-insulating layers stacked in the vertical direction (e.g., the Z direction). For example, each of the plurality of first sub-insulating layers of the first redistribution insulating layer 111 may include an insulating polymer, an epoxy, or a combination thereof. For example, the plurality of first sub-insulating layers may be formed from, for example, a photo imageable dielectric (PID) material or a photosensitive polyimide (PSPI) material.

The first conductive redistribution patterns 113 may include first conductive layers 1131 and first conductive via patterns 1133. Each of the first conductive layers 1131 may extend in the horizontal direction (for example, in X direction and/or Y direction), and may be disposed at different vertical levels to form a multi-layer distribution structure. The first conductive layers 1131 may be disposed on any one surface of an upper surface or a lower surface of each of the plurality of first sub-insulating layers of the first redistribution insulating layer 111. For example, the first conductive layers 1131 may include a line pattern extending in a line shape along any one surface of the upper and lower surfaces of one first sub-insulating layer of the plurality of first sub-insulating layers of the first redistribution insulating layer 111. The first conductive via patterns 1133 may electrically connect the first conductive layers 1131 to each other that are disposed at different vertical levels from one another. In some embodiments of the present inventive concept, each of the plurality of first conductive via patterns 1133 may have a tapered shape, in which a horizontal width thereof decreases in a direction from an upper side thereof to a lower side thereof. In other words, each of the first conductive via patterns 1133 may have a horizontal width that decreases as a lower surface of the first redistribution structure 110 is approached.

The first conductive redistribution patterns 113 may include first upper pads 117 and second upper pads 119 that are provided on the upper surface of the first redistribution insulating layer 111. The first upper pads 117 may be attached to first connection bumps 141. The second upper pads 119 may be attached to second connection bumps 143. The first conductive redistribution patterns 113 may include external connection pads 115 disposed under the lower surface of the first redistribution insulating layer 111. The external connection pads 115 may be respectively connected to the external connection terminals 145. In some embodiments of the present inventive concept, in a cross-sectional view, each external connection pad 115 may have a polygonal shape such as a rectangular shape. The external connection terminals 145 may be configured to electrically and physically connect the first redistribution structure 110 to an external device. The external connection terminals 145 may be formed of, for example, a solder ball or a solder bump.

For example, the first conductive redistribution patterns 113 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof.

The first conductive redistribution patterns 113 may include first seed metal patterns 1135 extending along surfaces of the first conductive layers 1131 and surfaces of the first conductive via patterns 1133. The first seed metal patterns 1135 may extend along a bottom surface of the corresponding first conductive layer 1131 and/or sidewalls and a bottom surface of the corresponding first conductive via pattern 1133. For example, the first seed metal patterns 1135 may include at least one of Cu, Ti, TiW, Ti nitride (TIN), Ta, Ta nitride (TaN), chromium (Cr), and/or Al.

At least some of a plurality of first conductive layers 1131 may be integrated together with the corresponding first conductive via pattern 1133. For example, some of the plurality of first conductive layers 1131 may be integrated together with the corresponding first conductive via pattern 1133 that are in contact with the lower side thereof. For example, the first conductive layers 1131 and the first conductive via patterns 1133 may be formed by using an electroplating process by using the first seed metal patterns 1135.

The intermediate connection structure ML may be disposed on the first redistribution structure 110. A footprint of the intermediate connection structure ML may be the same as a footprint of the first redistribution structure 110. An outer wall of the intermediate connection structure ML may be substantially vertically aligned with an outer wall of the first redistribution structure 110. The intermediate connection structure ML may include at least one of a connection substrate 120, a bridge chip 150, a plurality of conductive pillars 161, and a first molding layer 130.

The connection substrate 120 may provide an electrical signal path for transmitting an electrical signal between the first redistribution structure 110 and the second redistribution structure 170. The connection substrate 120 may be mounted above the first redistribution structure 110 via the first connection bumps 141.

The connection substrate 120 may include an insulating base layer 121, a plurality of through electrodes 123, and connection pads 125.

The insulating base layer 121 may have a plate shape in which an upper surface thereof and a lower surface thereof are generally in parallel with each other. For example, the insulating base layer 121 may have a cuboid shape. An upper surface 1211 of the insulating base layer 121 may include a plane perpendicular to the vertical direction (e.g., the Z direction). In some embodiments of the present inventive concept, the insulating base layer 121 may include an inorganic-based insulating material. In some embodiments of the present inventive concept, the insulating base layer 121 may be formed of glass, ceramic, and/or ceramic glass.

The plurality of through electrodes 123 may vertically penetrate the insulating base layer 121. In other words, each through electrode 123 may extend in the vertical direction (e.g., the Z direction) from the upper surface 1211 of the insulating base layer 121 to the lower surface of the insulating base layer 121. The plurality of through electrodes 123 may be spaced apart from each other in the horizontal direction (e.g., the X direction). The plurality of through electrodes 123 may be formed of, for example, a metal such as Cu. In some embodiments of the present inventive concept, the insulating base layer 121 may correspond to a glass substrate formed of glass, and each through electrode 123 may be referred to as a through glass via.

In some embodiments of the present inventive concept, the plurality of through electrodes 123 may be arranged to have a pitch between about 10 μm and about 30 μm. Because the through electrodes 123 may be arranged at a fine pitch in the connection substrate 120, redistribution patterns connected to the through electrodes 123 (for example, the first conductive redistribution patterns 113 and second conductive redistribution patterns 173) may also be formed at a fine pitch.

The connection pads 125 may be disposed under a lower surface of the insulating base layer 121. An upper surface of each connection pad 125 may directly contact a lower surface of the corresponding through electrode 123, and a lower surface of each connection pad 125 may directly contact the corresponding first connection bump 141. Each connection pad 125 may be electrically and physically connected to the corresponding first upper pad 117 of the first redistribution structure 110 via the corresponding first connection bump 141. In some embodiments of the present inventive concept, the first connection bumps 141 may be omitted, and the connection substrate 120 may be physically and electrically connected to the first redistribution structure 110 via a conductive film (for example, an anisotropic conductive film (ACF)).

The bridge chip 150 may be mounted above the first redistribution structure 110 via the second connection bumps 143. The bridge chip 150 may be spaced apart from the connection substrate 120 in a lateral direction, and may be disposed between the first redistribution structure 110 and the second redistribution structure 170 in the vertical direction (e.g., the Z direction). In some embodiments of the present inventive concept, the bridge chip 150 may vertically overlap each of the plurality of semiconductor devices (for example, the first semiconductor device 210 and the second semiconductor device 220). For example, the bridge chip 150 may include a portion vertically overlapping the first semiconductor device 210 and a portion vertically overlapping the second semiconductor device 220.

The bridge chip 150 may provide an electrical signal path for transmitting an electrical signal between each of the plurality of semiconductor devices. The bridge chip 150 may include a semiconductor substrate, which includes a semiconductor material such as silicon, and a distribution structure that is provided on the semiconductor substrate. The distribution structure may include a bridge circuit pattern 151 configured to electrically connect each of the plurality of semiconductor devices to each other.

The plurality of conductive pillars 161 may be disposed on the bridge chip 150, and may be spaced apart from each other along an upper surface of the bridge chip 150. The plurality of conductive pillars 161 may be electrically connected to the bridge circuit pattern 151. Each of the plurality of conductive pillars 161 may have a pillar shape or cylindrical shape extending in the vertical direction (e.g., the Z direction). The plurality of conductive pillars 161 may provide an electrical signal path for transmitting an electrical signal between the bridge circuit pattern 151 and the second redistribution structure 170. The plurality of conductive pillars 161 may be configured to electrically connect between each of the plurality of semiconductor devices, together with the bridge circuit pattern 151. For example, each conductive pillar 161 may include Cu.

The first molding layer 130 may be disposed on the first redistribution structure 110, and may cover at least a portion of the connection substrate 120, at least a portion of the bridge chip 150, and at least a portion of each conductive pillar 161. An upper surface 131 of the first molding layer 130 may include a flat or substantially flat surface that is perpendicular to the vertical direction (e.g., the Z direction), and outer walls of the first molding layer 130 may be vertically aligned with outer walls of the first redistribution structure 110. In some embodiments of the present inventive concept, the first molding layer 130 may be formed of an epoxy mold compound (EMC). The EMC may include an epoxy-based resin, and an inorganic filler and/or an organic filler included in the epoxy-based resin.

In some embodiments of the present inventive concept, the first molding layer 130 may extend continuously along the sidewalls and lower surfaces of the connection substrate 120, but might not cover an upper surface of the connection substrate 120. The first molding layer 130 may fill gaps that are between the connection substrate 120 and the first redistribution structure 110, and at least partially surround the first connection bumps 141 that are provided between the connection substrate 120 and the first redistribution structure 110.

In some embodiments of the present inventive concept, the first molding layer 130 may continuously extend along sidewalls, a lower surface, and the upper surface of the bridge chip 150. The first molding layer 130 may fill a gap that is between the bridge chip 150 and the first redistribution structure 110, and surround the first connection bumps 141 that are provided between the bridge chip 150 and the first redistribution structure 110. In addition, the first molding layer 130 may extend along sidewalls of each conductive pillar 161, but might not cover an upper surface of each conductive pillar 161.

In some embodiments of the present inventive concept, the upper surface 131 of the first molding layer 130 may be substantially coplanar with the upper surface of the connection substrate 120 and/or the upper surface of each conductive pillar 161. As illustrated in FIG. 2, the upper surface 131 of the first molding layer 130 and the upper surface 1211 of the insulating base layer 121 may be coplanar or substantially coplanar with each other, and may be continuously connected to each other without a step near an interface between the first molding layer 130 and the connection substrate 120.

In some embodiments of the present inventive concept, a first coefficient of thermal expansion (CTE) of the first material constituting the insulating base layer (121) may be less than a second CTE of the second material constituting the first molding layer 130. In some embodiments of the present inventive concept, the second CTE of the first molding layer 130 may be about 10 ppm/° C. to about 20 ppm/° C., and the first CTE of the insulating base layer 121 may be about 0.1 ppm/° C. to about 10 ppm/° C.

The second redistribution structure 170 may be disposed on the intermediate connection structure ML. A foot print of the second redistribution structure 170 may be the same as the foot print of the first redistribution structure 110 and the foot print of the intermediate connection structure ML. The outer walls of the second redistribution structure 170 may be vertically aligned with the outer walls of the intermediate connection structure ML. In the present inventive concept, a structure, in which the second redistribution structure 170 and the intermediate connection structure ML are combined, may be referred to as an interposer substrate.

The second redistribution structure 170 may include a second redistribution insulating layer 171 and the second conductive redistribution patterns 173.

The second redistribution insulating layer 171 may include a plurality of second sub-insulating layers stacked on each other in the vertical direction (e.g., the Z direction). For example, each of the plurality of second sub-insulating layers may have different thicknesses from each other. The material of the second redistribution insulating layer 171 may be substantially the same as the material of the first redistribution insulating layer 111. For example, each of the plurality of second sub-insulating layers may be formed of a PID material or a PSPI material.

The second conductive redistribution patterns 173 may include second conductive layers 1731 and second conductive via patterns 1733. Each of the second conductive layers 1731 may extend in the horizontal direction (for example, X direction and/or Y direction), and may be disposed at different vertical levels from one another to form a multi-layer distribution structure. The second conductive layers 1731 may be disposed on any one surface of an upper surface or a lower surface of each of the plurality of second sub-insulating layers of the second redistribution insulating layer 171. For example, the second conductive layers 1731 may include a line pattern extending along any one surface of the upper or lower surfaces of one second sub-insulating layer of the plurality of second sub-insulating layers of the second redistribution insulating layer 171. The second conductive via patterns 1733 may electrically connect the second conductive layers 1731 to each other, which are disposed at different vertical levels from one another. In some embodiments of the present inventive concept, each of the plurality of second conductive via patterns 1733 may have a tapered shape extending with a horizontal width decreasing in a direction from an upper side toward a lower side thereof. For example, the second conductive via patterns 1733 may penetrate a first second sub-insulating layer of the plurality of second sub-insulating layers, and the first second sub-insulating layer of the plurality of second sub-insulating layers may be disposed on the first molding layer 130 and the connection substrates 120. For example, the second conductive layers 1731 may be disposed on the first second sub-insulating layer, and a second second sub-insulating layer of the plurality of second sub-insulating layers may be disposed on the first second sub-insulating layer.

The second conductive redistribution patterns 173 may include upper pads 177 provided on the upper surface of the second redistribution insulating layer 171. For example, the upper pads 177 may penetrate the second redistribution insulating layer 171 to be connected to the second conductive layer 1731. For example, the upper pads 177 may be disposed on the second second sub-insulating layer of the plurality of second sub-insulating layers of the second redistribution insulating layer 171, and may penetrate the second second sub-insulating layer. The upper pads 177 may be attached to third connection bumps 231 or fourth connection bumps 233. The material of the second conductive redistribution patterns 173 may be substantially the same as the material of the first conductive redistribution patterns 113.

The second conductive redistribution patterns 173 may include second seed metal patterns 1735 extending along surfaces of the second conductive layers 1731 and surfaces of the second conductive via patterns 1733. Each of the second seed metal patterns 1735 may extend along a bottom surface of the corresponding second conductive layer 1731 and/or sidewalls and a bottom surface of the corresponding second conductive via pattern 1733. The material of the second seed metal patterns 1735 may be substantially the same as a material of the first seed metal patterns 1135.

At least a portion of the plurality of second conductive layers 1731 may be integrated together with the corresponding second conductive via pattern 1733. For example, a portion of a second conductive layer 1731 of the plurality of second conductive layers 1731 may be integrated together with the corresponding second conductive via pattern 1733 that is in contact with a lower side surface of the second conductive layer 1731. For example, the second conductive layers 1731 and the second conductive via patterns 1733 may be formed by using an electroplating process by using the second seed metal patterns 1735.

In some embodiments of the present inventive concept, a lower surface of the second redistribution insulating layer 171 may be in direct contact with the upper surface 131 of the first molding layer 130 and the upper surface 1211 of the insulating base layer 121. For example, a lower surface of the first second sub-insulating layer of the plurality of second sub-insulating layers of the second redistribution insulating layer 171 may be in direct contact with the upper surface 131 of the first molding layer 130 and the upper surface 1211 of the insulating base layer 121. At an interface between the second redistribution structure 170 and the first molding layer 130, the second redistribution insulating layer 171 may extend continuously along the upper surface 131 of the first molding layer 130. At an interface between the second redistribution structure 170 and the connection substrate 120, the second redistribution insulating layer 171 may extend continuously along the upper surface 1211 of the insulating base layer 121.

In some embodiments of the present inventive concept, an upper surface 1231 of each through electrode 123 of the connection substrate 120 may contact the corresponding second conductive via pattern 1733 among the second conductive via patterns 1733. For example, as illustrated in FIG. 2, a first portion of the upper surface 1231 of each through electrode 123 may contact the corresponding second conductive via pattern 1733, and a second portion of the upper surface 1231 of each through electrode 123 may contact the second redistribution insulation layer 171. The first portion of the upper surface 1231, which is in contact with the second conductive via pattern 1733, may be the center of the upper surface 1231 of each through electrode 123, and the second portion of the upper surface 1231, which is in contact with the second redistribution insulating layer 171, may be an outer portion of the upper surface 1231 of each through electrode 123. Each second conductive via pattern 1733 may have a horizontal width that is reduced as the upper surface 1231 of the through electrode 123 is approached.

In some embodiments of the present inventive concept, an upper surface (refer to 1611 in FIG. 8) of each conductive pillar 161 may contact the corresponding second conductive via pattern 1733 among the second conductive via patterns 1733. For example, a portion of the upper surface 1611 of each conductive pillar 161 may contact the corresponding second conductive via pattern 1733, and the other portion of the upper surface 1611 of each conductive pillar 161 may contact the second redistribution insulating layer 171.

Each of the plurality of semiconductor devices may be mounted on the second redistribution structure 170. The plurality of semiconductor devices may be mounted on the second redistribution structure 170 to be spaced apart from each other in the lateral direction. The plurality of semiconductor devices may be electrically connected to each other via the second conductive redistribution patterns 173, the plurality of conductive pillars 161, and/or the bridge circuit pattern 151 of the bridge chip 150.

In some embodiments of the present inventive concept, the plurality of semiconductor devices may include the first semiconductor device 210 and the second semiconductor device 220. The first semiconductor device 210 and the second semiconductor device 220 may include heterogeneous semiconductor devices. In some embodiments of the present inventive concept, the first semiconductor device 210 may include a logic device, and the second semiconductor device 220 may include a memory device. In some embodiments of the present inventive concept, the logic chip may include a microprocessor, a graphics processor, a signal processor, a network processor, an artificial intelligence semiconductor, a chipset, an audio codec, a video codec, and an application processor. In some embodiments of the present inventive concept, the memory chip may include a DRAM chip, an SRAM chip, an MRAM chip, a NAND flash memory chip, and/or a high bandwidth memory (HBM) chip.

The first semiconductor device 210 may be mounted on the second redistribution structure 170 via the third connection bumps 231. The first semiconductor device 210 may include the first semiconductor substrate 211 and first bump pads 213 that are provided on a lower surface of the first semiconductor substrate 211. The first bump pads 213 may be respectively attached to the third connection bumps 231, and may be electrically connected to the corresponding upper pads 177 of the second redistribution structure 170 via the third connection bumps 231, respectively. A first underfill material layer 235 formed of an underfill material may be disposed in gaps that are between the first semiconductor device 210 and the second redistribution structure 170. The first underfill material layer 235 may at least partially surround the third connection bumps 231.

The second semiconductor device 220 may be mounted on the second redistribution structure 170 via the fourth connection bumps 233. A second underfill material layer 237 formed of an underfill material may be disposed in gaps that are between a fourth semiconductor device and the second redistribution structure 170. The second underfill material layer 237 may at least partially surround the fourth connection bumps 233.

The second semiconductor device 220 may include the second semiconductor substrate 221, an upper connection pad 222, a lower connection pad 223, a connection terminal 225, a through electrode 227, and an inner molding layer 229.

The second semiconductor device 220 may include a plurality of slices, and each of the plurality of slices may include a second semiconductor substrate 221. A plurality of second semiconductor substrates 221 may constitute a chip stack and may be stacked in the vertical direction (e.g., the Z direction). The plurality of second semiconductor substrates 221 may be substantially the same as each other. In other words, the second semiconductor device 220 may have a stacked structure in which each of the plurality of slices operates as a memory chip, and data merging is possible between each other.

Each of the plurality of second semiconductor substrates 221 may have an active surface and an inactive surface facing each other. In this case, the inactive surface of the second semiconductor substrate 221 that is the uppermost second semiconductor substrate 221 of the plurality of second semiconductor substrates 221 may be an upper surface of the second semiconductor device 220 which is exposed to the outside of the semiconductor package 10. Each of the plurality of second semiconductor substrates 221 may include the through electrode 227. The through electrode 227 may include, for example, a through silicon via (TSV).

The upper connection pad 222 may be connected to an upper side of the through electrode 227, and the lower connection pad 223 may be connected to a lower side of the through electrode 227. In addition, the lower connection pad 223 may be provided on the active surface of the second semiconductor substrate 221 and may be electrically connected to a semiconductor distribution layer including a distribution pattern.

The connection terminal 225 may be disposed between two adjacent second semiconductor substrates 221 in the vertical direction (e.g., the Z direction). In addition, the second semiconductor substrate 221 that is the lowermost second semiconductor substrate 221 of the plurality of second semiconductor substrates 221 may be electrically and physically connected to the second conductive redistribution patterns 173 of the second redistribution structure 170 via the fourth connection bumps 233.

The inner molding layer 229 may at least partially surround the plurality of second semiconductor substrates 221. The inner molding layer 229 might not cover an upper surface of the uppermost second semiconductor substrate 221. The inner molding layer 229 may be formed of, for example, EMC.

The second molding layer 239 may be disposed on the second redistribution structure 170, and may cover at least a portion of each of the plurality of semiconductor devices. The second molding layer 239 may at least partially surround the sidewalls of the first semiconductor device 210, but might not cover an upper surface of the first semiconductor device 210 so that the upper surface of the first semiconductor device 210 is exposed to the outside of the semiconductor package 10. In addition, the second molding layer 239 may at least partially surround the sidewalls of the second semiconductor device 220, but might not cover the upper surface of the second semiconductor device 220 so that the upper surface of the second semiconductor device 220 is exposed to the outside of the semiconductor package 10. The second molding layer 239 may be formed of, for example, EMC.

According to some embodiments of the present inventive concept, the insulating base layer 121 of the connection substrate 120 may include a material having a CTE less than that of a material constituting the first molding layer 130 so that the connection substrate 120 may function as a reinforcement member configured to strengthen rigidity of the semiconductor package 10, and accordingly, warpage of the semiconductor package 10 may be prevented.

Figure 3:
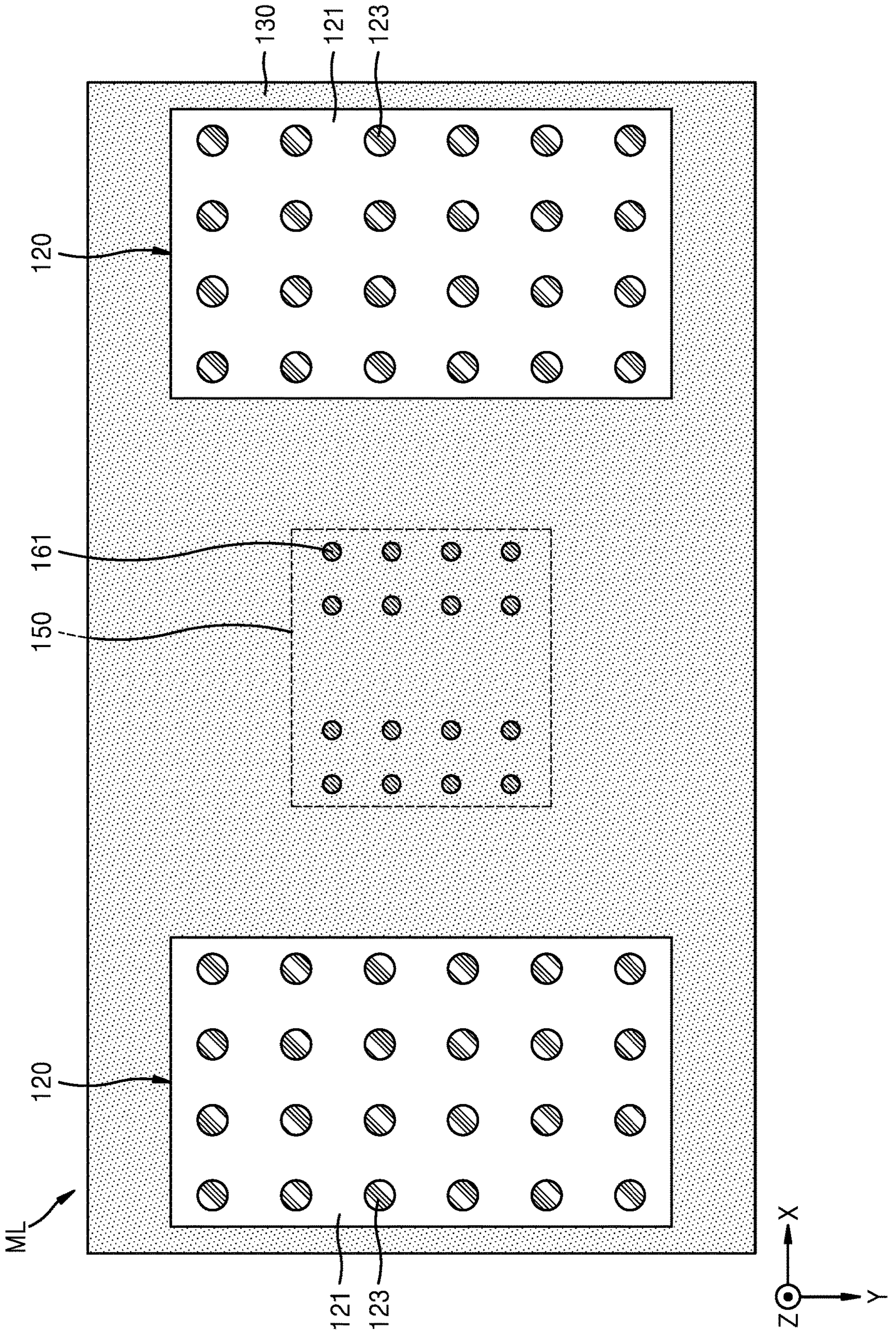
FIG. 3 is a plan view of an intermediate connection structure of a semiconductor package, according to an embodiment of the present inventive concept.
Figure 4:
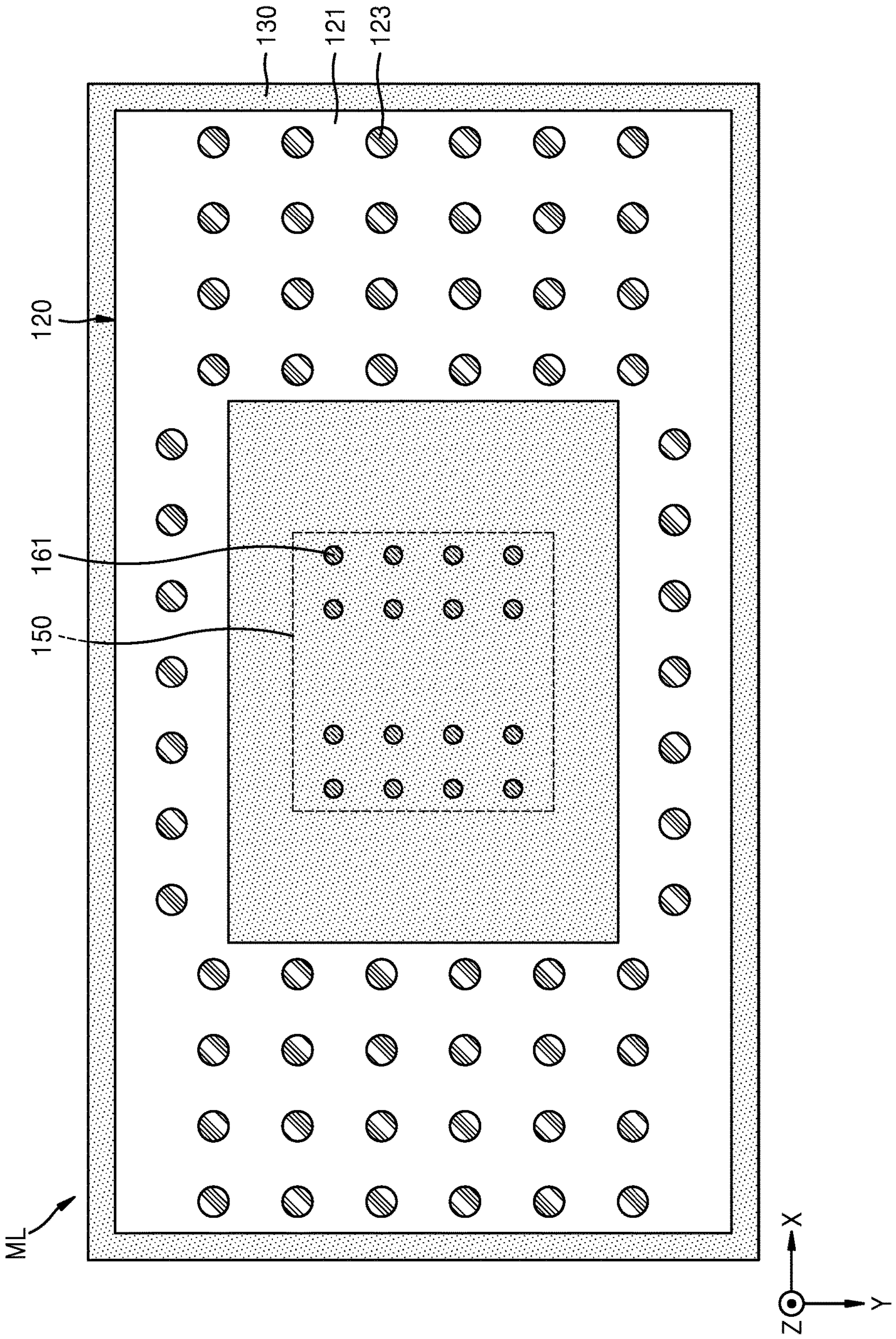
FIG. 4 is a plan view of an intermediate connection structure of a semiconductor package, according to an embodiment of the present inventive concept.

FIGS. 3 and 4 are plan views of the intermediate connection structure ML of the semiconductor package 10, according to embodiments of the present inventive concept.

Referring to FIG. 3, in the intermediate connection structure ML, the connection substrate 120 may include the insulating base layer 121 having a plurality of segments spaced apart from each other, and the plurality of through electrodes 123 provided in each of the plurality of segments of the insulating base layer 121. For example, the plurality of segments of the base layer 121 may be horizontally spaced apart from each other with the bridge chip 150 therebetween.

Referring to FIG. 4, in the intermediate connection structure ML, the connection substrate 120 may include a base layer 121 of an annular shape which extends to surround the bridge chip 150. In a plan view, the base layer 121 may be configured as a single body continuously extending to surround the bridge chip 150. For example, the base layer 121 may completely surround the bridge chip 150.

FIGS. 5 through 9 are cross-sectional views illustrating a method of manufacturing the semiconductor package 10, according to embodiments of the present inventive concept. Below, a method of fabricating the semiconductor package 10 described with reference to FIGS. 1 and 2 is described with reference to FIGS. 5 through 9.

Figure 5:
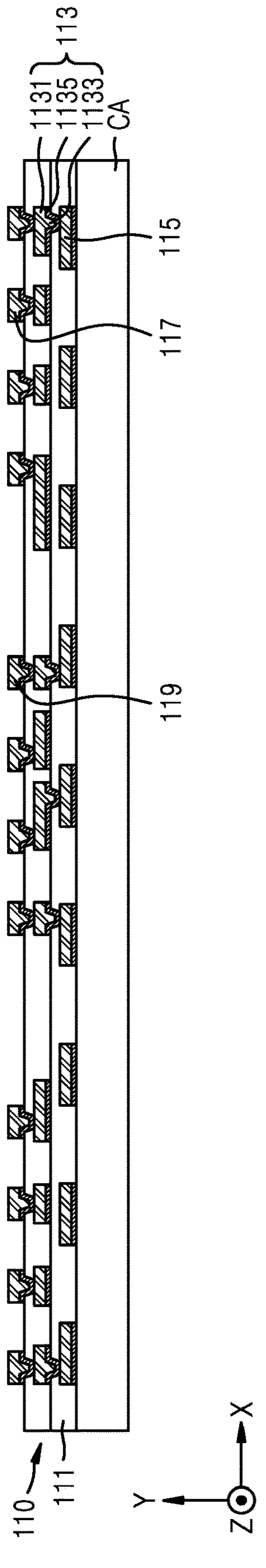
FIGS. 5, 6, 7, 8 and 9 are cross-sectional views illustrating a method of manufacturing a semiconductor package, according to embodiments of the present inventive concept.

Referring to FIG. 5, the first redistribution structure 110 may be formed on a carrier substrate CA. The first redistribution structure 110 may include the first redistribution insulating layer 111, which includes the plurality of first sub-insulating layers stacked sequentially on the carrier substrate CA, and the first conductive redistribution patterns 113 that are formed in the first redistribution insulating layer 111.

To form the first redistribution structure 110, an external connection pad 115 may be first formed on the carrier substrate CA. The external connection pad 115 may be formed by using a plating process. For example, after the first seed metal pattern 1135 is formed on the carrier substrate CA, the external connection pad 115 may be formed by performing a plating process by using the first seed metal pattern 1135. After the external connection pad 115 is formed, a metal wiring process may be performed to form an insulating layer, which covers the external connection pad 115 but has a via hole, the first conductive via pattern 1133, which fills the via hole of the insulating layer, and the first conductive layer 1131, which extends along an upper surface of the insulating layer. The metal wiring process for forming the first conductive via patterns 1133 and the first conductive layer 1131 may include a plating process by using the first seed metal pattern 1135. Next, by performing each of the insulating layer forming process and the metal distribution process for at least one time, the first redistribution structure 110 having a multi-layer distribution structure may be formed.

Figure 6:
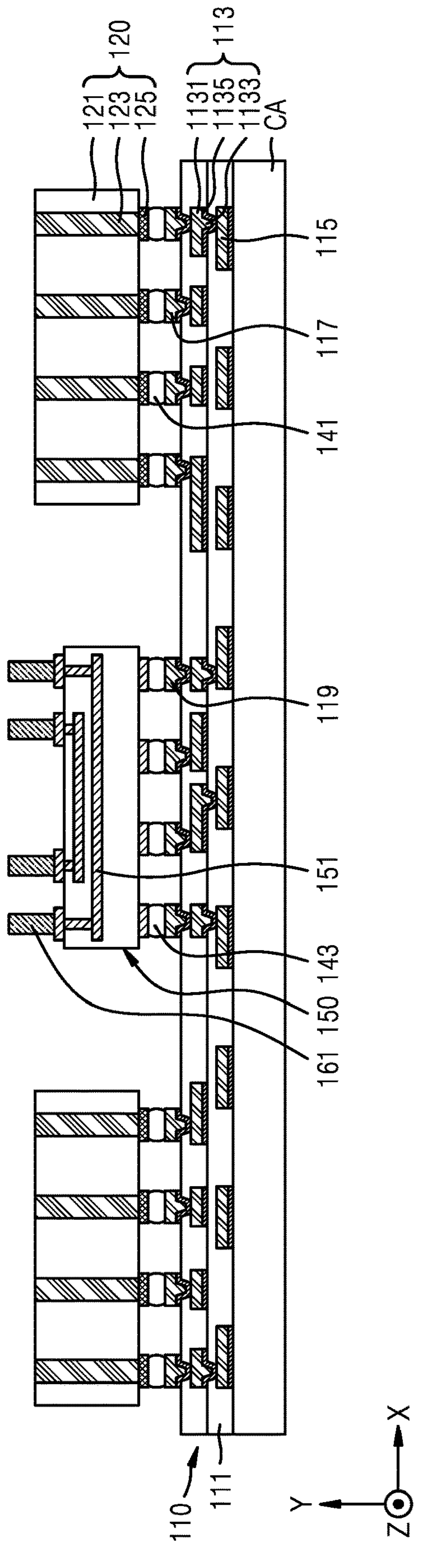

Referring to FIG. 6, the connection substrate 120 may be mounted on the first redistribution structure 110. The connection substrate 120 may be mounted above the first redistribution structure 110 via the first connection bumps 141. After the connection substrate 120 is mounted on the first redistribution structure 110, the bridge chip 150 including the conductive pillars 161 may be mounted on the first redistribution structure 110. The bridge chip 150 may be mounted above the first redistribution structure 110 via the second connection bumps 143.

Figure 7:
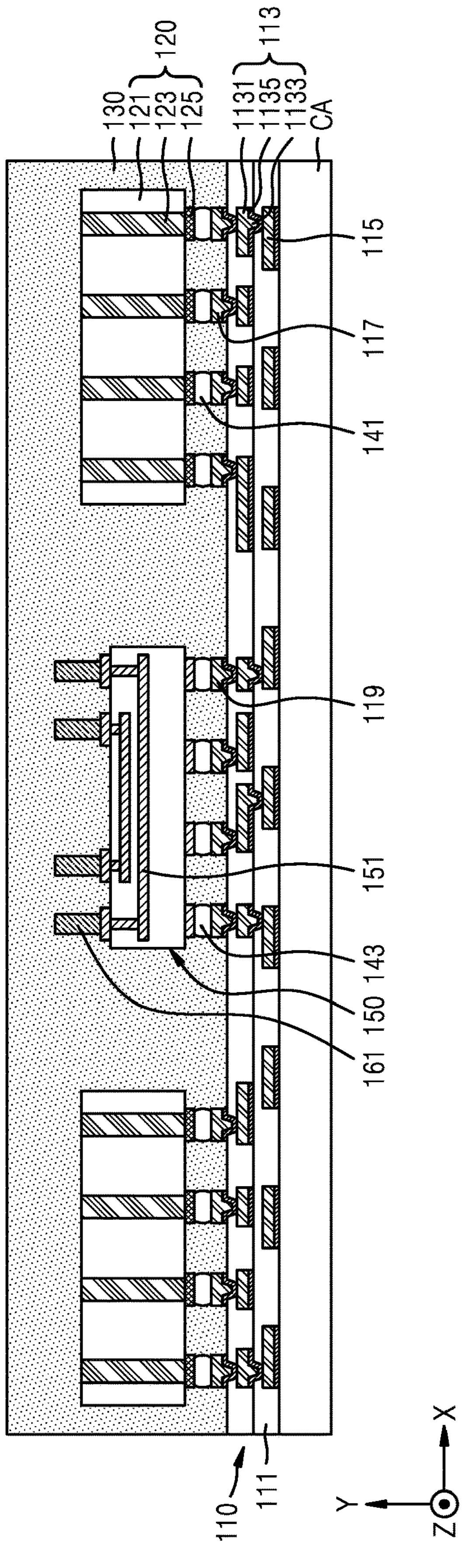

Referring to FIG. 7, the connection substrate 120, the bridge chip 150, and the first molding layer 130, which covers the conductive pillars 161, may be formed on the first redistribution structure 110. To form the first molding layer 130, the molding material may be supplied onto the carrier substrate CA, and then cured.

Figure 8:
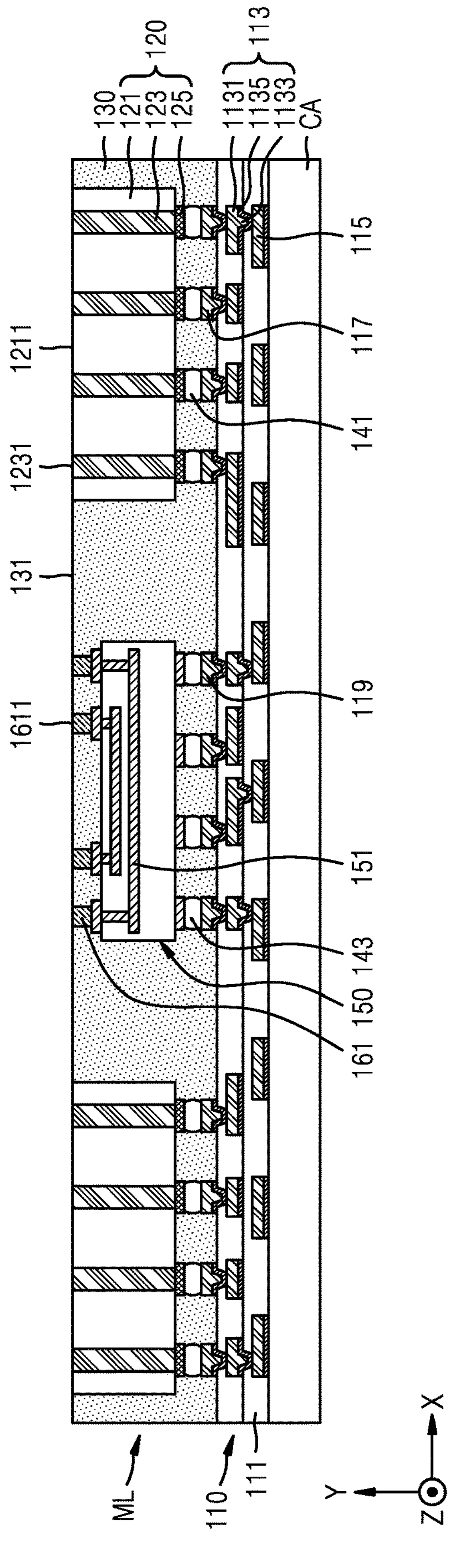

Referring to FIG. 8, a portion of the first molding layer 130 may be removed to expose the connection substrate 120 and the conductive pillars 161. To remove a portion of the first molding layer 130, a chemical mechanical polishing (CMP) process, a grinding process, or the like may be performed from an upper side of a structure illustrated in FIG. 7. For example, a portion of the upper side of the first molding layer 130, a portion of the upper side of the connection substrate 120, and a portion of the upper side of each conductive pillar 161 may be removed by using polishing process such as chemical mechanical polishing (CMP) process. In some embodiments of the present inventive concept, as a result of the polishing process described above, the polished upper surface 131 of the first molding layer 130 may be coplanar or substantially coplanar with the polished upper surface 1211 of the insulating base layer 121, the polished upper surface 1231 of the through electrode 123, and/or the polished upper surface 1611 of the conductive pillar 161. The connection substrate 120, the bridge chip 150, the conductive pillars 161, and the first molding layer 130 may constitute the intermediate connection structure ML.

Figure 9:
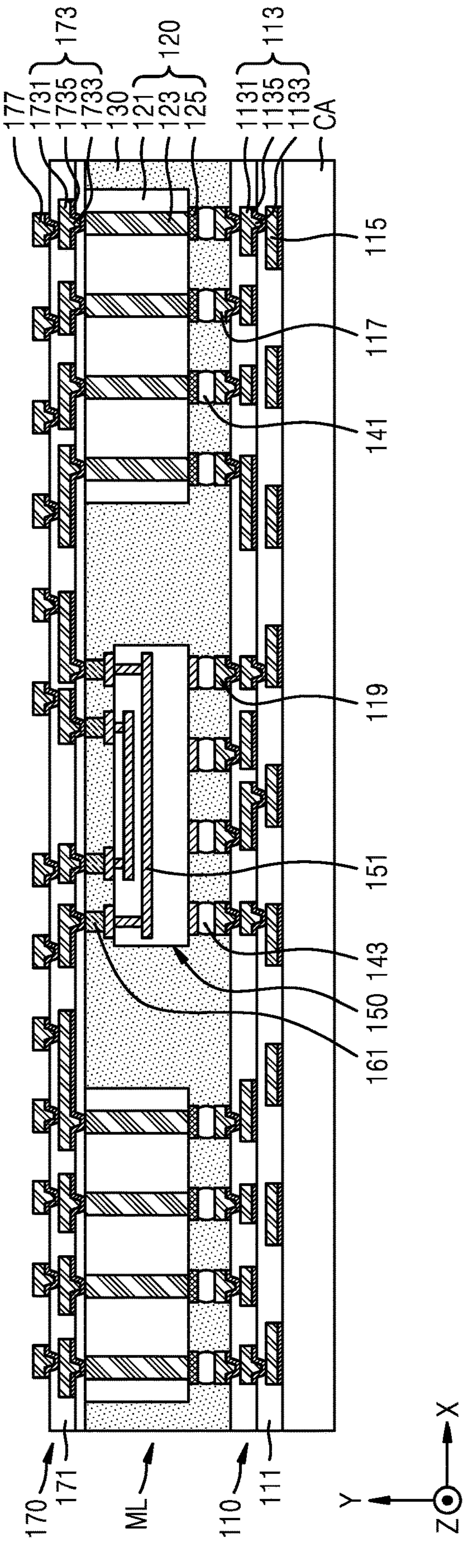

Referring to FIG. 9, the second redistribution structure 170 may be formed on the intermediate connection structure ML. The second redistribution structure 170 may include the second redistribution insulating layer 171 and the second conductive redistribution patterns 173. The second redistribution insulating layer 171 may include the plurality of second sub-insulating layers stacked sequentially on the intermediate connection structure ML, and the second conductive redistribution patterns 173 may be formed in the second redistribution insulating layer 171.

To form the second redistribution structure 170, a metal distribution process may be performed to form an insulating layer, which includes via holes, on the upper surface of the intermediate connection structure ML. The metal distribution process may also be performed to form the second conductive via patterns 1733, which fill the via holes of the insulating layer, and the second conductive layer 1731, which extends along an upper surface of the insulating layer. The metal wiring process for forming the second conductive via patterns 1733 and the second conductive layer 1731 may include a plating process using the second seed metal patterns 1735. Next, by performing each of the insulating layer forming process and the metal distribution process for at least one time, the second redistribution structure 170 having a multi-layer distribution structure may be formed.

Next, referring to FIG. 1, after the second redistribution structure 170 is formed, the first semiconductor device 210 and the second semiconductor device 220 may be mounted on the second redistribution structure 170. The first semiconductor device 210 may be mounted on the second redistribution structure 170 via the third connection bumps 231, and the second semiconductor device 220 may be mounted on the second redistribution structure 170 via the fourth connection bumps 233. After the first semiconductor device 210 and the second semiconductor device 220 are mounted on the second redistribution structure 170, an underfill process may be performed to form the first underfill material layer 235, which fills the gap between the first semiconductor device 210 and the second redistribution structure 170, and the second underfill material layer 237, which fills the gap between the second semiconductor device 220 and the second redistribution structure 170. After the first underfill material layer 235 and the second underfill material layer 237 are formed, a molding process may be performed to form the second molding layer 239 which molds the first semiconductor device 210 and the second semiconductor device 220. For example, the second molding layer 239 may be formed on the first semiconductor device 210 and the second semiconductor device 220. After the second molding layer 239 is formed, the carrier substrate (CA in FIG. 9) may be removed, and the external connection terminals 145 may be attached to the lower side of the first redistribution structure 110 which is exposed due to the removal of the carrier substrate CA. For example, the connection terminals 145 may be attached to the external connection pads 115.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor package comprising:

a first redistribution structure including a first insulating layer and first conductive patterns;

a connection substrate disposed on the first redistribution structure, and including a base layer and a through electrode penetrating the base layer, wherein the base layer includes a first material;

a molding layer at least partially surrounding the connection substrate and disposed on the first redistribution structure, wherein the molding layer includes a second material;

a second redistribution structure disposed on the molding layer and the connection substrate, and including a second insulating layer and second conductive patterns; and a plurality of semiconductor devices spaced apart from each other on the second redistribution structure, wherein a first thermal expansion coefficient of the first material of the base layer is less than a second thermal expansion coefficient of the second material of the molding layer, and wherein an upper surface of the base layer is substantially coplanar with an upper surface of the molding layer.

2. The semiconductor package of claim 1, wherein the base layer comprises glass.

3. The semiconductor package of claim 1, wherein the base layer comprises ceramic.

4. The semiconductor package of claim 1, wherein the second insulating layer extends along the upper surface of the base layer and the upper surface of the molding layer, and wherein the second redistribution structure is in direct contact with the upper surface of the molding layer and the upper surface of the base layer.

5. The semiconductor package of claim 4, wherein the base layer comprises glass, the molding layer comprises an epoxy molding compound, and the second insulating layer comprises polyimide.

6. The semiconductor package of claim 1, wherein the second conductive patterns comprise a conductive via pattern extending in the second insulating layer and contacting an upper surface of the through electrode.

7. The semiconductor package of claim 6, wherein a horizontal width of the conductive via pattern decreases as it approaches the upper surface of the through electrode.

8. The semiconductor package of claim 7, wherein the upper surface of the through electrode comprises a first portion and a second portion, wherein the first portion is in contact with the conductive via pattern, and the second portion is in contact with the second insulating layer.

9. The semiconductor package of claim 1, wherein the connection substrate is connected to the first redistribution structure through a first connection bump.

10. The semiconductor package of claim 1, further comprising a bridge chip disposed in the molding layer and including a bridge circuit pattern configured to electrically connect the plurality of semiconductor devices to each other.

11. The semiconductor package of claim 10, further comprising a conductive pillar disposed on the bridge chip, and configured to electrically connect the bridge circuit pattern to the second conductive patterns, wherein the molding layer extends along sidewalls of the conductive pillar.

12. The semiconductor package of claim 10, wherein the base layer of the connection substrate comprises a plurality of segments spaced apart from each other with the bridge chip therebetween.

13. The semiconductor package of claim 10, wherein the base layer of the connection substrate has an annular shape surrounding the bridge chip.

14. A semiconductor package comprising:

a first redistribution structure including a first insulating layer and first conductive patterns;

a connection substrate disposed on the first redistribution structure, and including a base layer and a through electrode configured to penetrate the base layer, wherein the base layer comprises glass;

a molding layer at least partially surrounding the connection substrate on the first redistribution structure and including an epoxy mold compound;

a second redistribution structure disposed on the molding layer and the connection substrate, and including a second insulating layer and second conductive patterns; and a plurality of semiconductor devices spaced apart from each other on the second redistribution structure, wherein an upper surface of the base layer is substantially coplanar with an upper surface of the molding layer, and wherein the second insulating layer extends along the upper surface of the base layer and the upper surface of the molding layer.

15. The semiconductor package of claim 14, wherein the second conductive patterns comprise a conductive via pattern extending in the second insulating layer and contacting an upper surface of the through electrode, and wherein a horizontal width of the conductive via pattern decreases as it approaches the upper surface of the through electrode.

16. The semiconductor package of claim 15, wherein the upper surface of the through electrode comprises a first portion and a second portion, wherein the first portion is in contact with the conductive via pattern, and the second portion is in contact with the second insulating layer, and wherein the second conductive patterns further comprise a seed metal pattern provided between the conductive via pattern and the upper surface of the through electrode.

17. A semiconductor package comprising:

a first redistribution structure including a first insulating layer and first conductive patterns;

a connection substrate mounted on the first redistribution structure, and including a base layer and a through electrode configured to penetrate the base layer, wherein the base layer includes a first material;

first connection bumps disposed between the connection substrate and the first redistribution structure;

a bridge chip mounted on the first redistribution structure and spaced apart from the connection substrate in a lateral direction, wherein the bridge chip includes a bridge circuit pattern;

second connection bumps disposed between the bridge chip and the first redistribution structure;

a plurality of conductive pillars disposed on the bridge chip, and electrically connected to the bridge circuit pattern;

a molding layer at least partially surrounding the connection substrate and the bridge chip on the first redistribution structure and including a second material;

a second redistribution structure disposed on the molding layer and the connection substrate, and including a second insulating layer and second conductive patterns; and a plurality of semiconductor devices spaced apart from each other and disposed on the second redistribution structure, wherein a first thermal expansion coefficient of the first material of the base layer is less than a second thermal expansion coefficient of the second material of the molding layer, wherein an upper surface of the base layer is substantially coplanar with an upper surface of the molding layer, wherein the second insulating layer extends along the upper surface of the base layer and the upper surface of the molding layer, and wherein the second conductive patterns comprise a conductive via pattern extending in the second insulating layer and contacting an upper surface of the through electrode.

18. The semiconductor package of claim 17, wherein the molding layer at least partially surrounds each of the first connection bumps, each of the second connection bumps, and each of the conductive pillars.

19. The semiconductor package of claim 17, wherein the base layer comprises glass, the molding layer comprises an epoxy molding compound, and the second insulating layer comprises polyimide.

20. The semiconductor package of claim 17, wherein the first thermal expansion coefficient of the first material of the base layer is about 0.1 ppm/° C. to about 10 ppm/° C., and the second thermal expansion coefficient of the second material of the molding layer is about 10 ppm/° C. to about 20 ppm/° C.

* * * * *